(12) United States Patent
Chen et al.

(10) Patent No.: US 12,349,432 B2
(45) Date of Patent: Jul. 1, 2025

(54) ENLARGED BACKSIDE CONTACT

(71) Applicant: Taiwan Semiconductor Manufacturing Company, Ltd., Hsinchu (TW)

(72) Inventors: Bwo-Ning Chen, Keelung (TW); Xusheng Wu, Hsinchu (TW); Yin-Pin Wang, Kaohsiung (TW); Yuh-Sheng Jean, Hsinchu (TW); Chang-Miao Liu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 565 days.

(21) Appl. No.: 17/458,734

(22) Filed: Aug. 27, 2021

(65) Prior Publication Data

US 2023/0060786 A1 Mar. 2, 2023

(51) Int. Cl.
*H10D 64/01* (2025.01)
*H10D 30/01* (2025.01)
*H10D 30/67* (2025.01)

(52) U.S. Cl.
CPC .......... *H10D 64/01* (2025.01); *H10D 30/031* (2025.01); *H10D 30/6729* (2025.01); *H10D 30/6735* (2025.01); *H10D 30/6757* (2025.01); *H10D 30/6758* (2025.01)

(58) Field of Classification Search
CPC .......... H01L 29/401; H01L 29/414733; H01L 29/41766; H01L 29/41725; H01L 29/42392; H01L 29/66742; H01L 29/66439; H01L 29/78603; H01L 29/78696; H01L 29/785; H01L 29/775; H01L 29/0847; H01L 29/0673; H01L 29/0642; H01L 29/0665; H01L 21/823475; H01L 21/823431; B82Y 10/00; H10D 64/01; H10D 30/031; H10D 30/014; H10D 64/251; H10D 84/0149
See application file for complete search history.

(56) References Cited

U.S. PATENT DOCUMENTS

| | | | |
|---|---|---|---|
| 11,289,606 B2 * | 3/2022 | Ju ...................... | H01L 29/66742 |
| 11,581,224 B2 * | 2/2023 | Su ...................... | H01L 21/76897 |
| 11,615,987 B2 * | 3/2023 | Huang .............. | H01L 21/76831 |
| | | | 257/401 |

(Continued)

FOREIGN PATENT DOCUMENTS

CN 113206062 A * 8/2021 ....... H01L 21/76897

*Primary Examiner* — Bitew A Dinke
(74) *Attorney, Agent, or Firm* — HAYNES AND BOONE, LLP

(57) ABSTRACT

A method includes performing a first etching process on a backside of a substrate to expose a dummy contact structure, performing a first deposition process to deposit a first portion of an oxide layer around the dummy contact structure, performing a second etching process to at least partially remove the first portion of oxide layer, forming a spacer layer around the dummy contact structure, performing a second deposition process to form a second portion of the oxide layer around the spacer layer, removing the spacer layer and the dummy contract structure to leave an opening, and filling the opening with a conductive material to form a conductive plug.

20 Claims, 18 Drawing Sheets

(56) References Cited

U.S. PATENT DOCUMENTS

| | | | | |
|---|---|---|---|---|
| 11,637,101 B2* | 4/2023 | Huang | ............. | H01L 29/42392 |
| | | | | 257/288 |
| 11,961,915 B2* | 4/2024 | Ju | ..................... | H01L 29/41733 |
| 11,973,077 B2* | 4/2024 | Huang | ................ | H01L 29/78696 |
| 12,068,200 B2* | 8/2024 | Huang | ................ | H01L 29/0847 |
| 12,068,378 B2* | 8/2024 | Huang | ............. | H01L 29/66545 |
| 12,074,204 B2* | 8/2024 | Chang | .................. | H01L 29/775 |
| 2002/0102854 A1* | 8/2002 | Givens | ............... | H01L 21/7684 |
| | | | | 438/692 |
| 2014/0191299 A1* | 7/2014 | Wang | ............... | H01L 29/66545 |
| | | | | 438/585 |
| 2016/0181399 A1* | 6/2016 | Jun | ................. | H01L 21/823475 |
| | | | | 438/294 |
| 2016/0343858 A1* | 11/2016 | Kim | ............... | H01L 21/823468 |
| 2019/0088542 A1* | 3/2019 | Hsieh | ............... | H01L 29/41791 |
| 2019/0252247 A1* | 8/2019 | Lee | ......................... | H01L 23/50 |
| 2020/0294998 A1* | 9/2020 | Lilak | ................ | H01L 23/53295 |
| 2021/0043506 A1* | 2/2021 | Shaviv | ............. | H01L 21/76865 |
| 2021/0391536 A1* | 12/2021 | Ando | ................... | H10N 70/041 |
| 2021/0408246 A1* | 12/2021 | Ganguly | ........... | H01L 21/76897 |
| 2022/0139911 A1* | 5/2022 | Wei | .................. | H01L 29/78696 |
| | | | | 257/365 |
| 2022/0384589 A1* | 12/2022 | Su | ..................... | H01L 29/42376 |
| 2022/0392896 A1* | 12/2022 | Guler | ............... | H01L 29/66439 |

* cited by examiner

ENLARGED BACKSIDE CONTACT

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC structures (such as three-dimensional transistors) and processing and, for these advancements to be realized, similar developments in IC processing and manufacturing are needed. For example, device performance (such as device performance degradation associated with various defects) and fabrication cost of field-effect transistors become more challenging when device sizes continue to decrease. Although methods for addressing such a challenge have been generally adequate, they have not been entirely satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
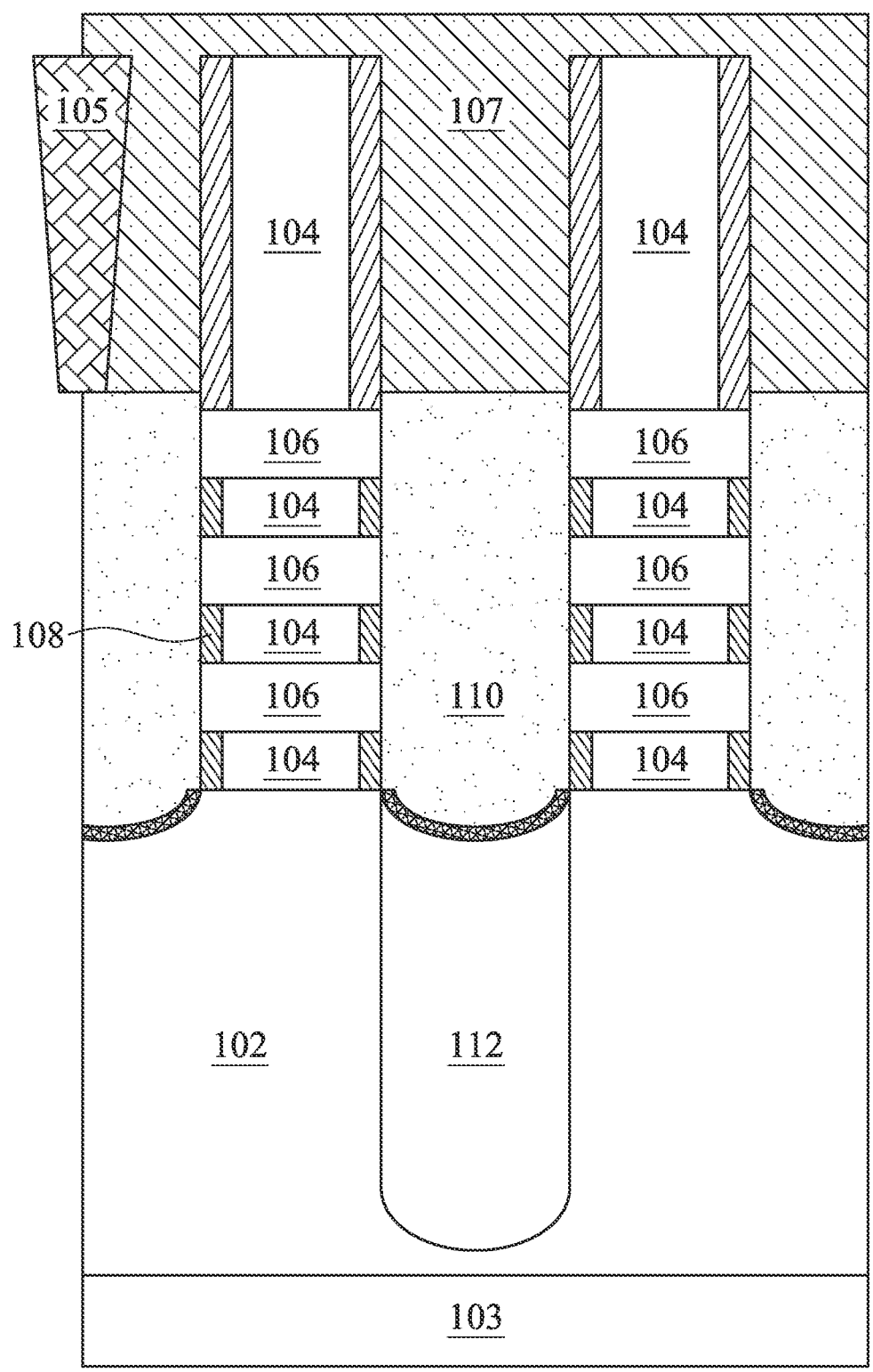
FIGS. 1A, 1B, 1C, 1D, 1E, 1F, 1G, 1H, 1I, and 1J are diagrams showing an illustrative process for forming an enlarged backside contact with a wider portion and a narrower portion, according to one example of principles described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices and the fabrication thereof, and more particularly to methods of fabricating field-effect transistors (FETs), such as fin-like FETs (FinFETs), gate-all-around FETs (GAA FETs), and/or other FETs.

Layers of the semiconductor materials are configured to provide nanowire or nanosheet devices such as GAA FETs, the details of forming which are provided below. GAA FETs have been introduced in effort to improve gate control by increasing gate-channel coupling, reduce OFF-state current, and reduce short-channel effects. A multi-gate device such as a GAA FET generally includes a gate structure that extends around its channel region (horizontal or vertical), providing access to the channel region on all sides. The GAA FETs are generally compatible with CMOS processes, allowing them to be aggressively scaled down while maintaining gate control and mitigating short-channel effects. Of course, the present disclosure is not limited to forming GAA FETs only and may provide other three-dimensional FETs such as FinFETs.

According to principles described herein, methods and devices are provided that allow for providing a contact to a terminal of GAA device from the backside of the substrate. Providing one or more contacts from the backside of the device, while maintaining other contacts from the frontside of the device allows for tighter pitch devices. When forming the source and the drain structures, a recess for one of the source or drain structure, where a backside contact is desired, is extended deeper into the substrate. Then, a dummy contact material is formed within the lower portion of extended recess for the source/drain structure. After the dummy contact material is formed, then the source and drain regions can be epitaxially grown within their respective recesses. Afterwards, during the backside processing, the dummy source contact is exposed, removed, and then replaced with a real conductive contact.

To reduce the resistance within the backside contact, and thus improve device performance, it may be desirable for the backside contact to be enlarged, according to principles described herein. In particular, in some implementations, after the dummy contact structure is exposed, a sidewall spacer may formed thereon. Then, a dielectric layer may be formed around the dummy contract structure and sidewall spacer. The sidewall spacer and the dummy contact structure may then be removed, leaving a trench. The trench may then be filled with a conductive material to form the backside contact. Because the spacer layer formed a larger space, the backside contact will be larger than the original trench in which the dummy contact structure was formed. The larger sized backside contact results in improved resistance and capacitance.

FIGS. 1A, 1B, 1C, 1D, 1E, 1F, 1G, 1H, 1I, and 1J are diagrams showing an illustrative process for forming an enlarged backside contact with a wider portion and a narrower portion of the backside contact for a GAA device. FIG. 1A is a diagram showing a cross-sectional view of an illustrative workpiece.

The workpiece includes a semiconductor substrate 102. The semiconductor substrate 102 may be a silicon substrate. The semiconductor substrate may be part of a silicon wafer. Other semiconductor materials are contemplated. The substrate 102 may include an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 102 may be a single-layer material having a uniform composition. Alternatively, the substrate 102 may include multiple material layers having similar or different compositions suitable for IC device manufacturing. In one example, the substrate 102 may be a silicon-on-insulator (SOI) substrate having a silicon layer formed on a silicon oxide layer. In another example, the substrate 102 may include a conductive layer, a semiconductor layer, a dielectric layer, other layers, or combinations thereof. An oxide layer 103 may be formed over a backside of the substrate 102.

FIG. 1A illustrates fin stacks that include several channel regions 106 or nanostructures of a GAA surrounded by gate structures 104. Source or drain structures 110 are disposed adjacent the gate structures and interfacing the channel regions 106. Inner spacers 108 are placed along the gate structures 104 between channels 106 to isolate the gate structure 104 from the source or drain structure 110. An interlayer dielectric (ILD) layer 107 is disposed over the substrate 102.

A brief description of these features is provided below. In some example embodiments, to form a GAA device, a semiconductor fin may be formed to include a total of plurality (e.g., three to ten) alternating layers of semiconductor materials. Alternating layers of the semiconductor materials are configured to provide channel regions for the nanowire or nanosheet devices such as GAA FETs, while the other alternating layers are sacrificial defining a gap between the channel layers within which the gate structure is formed. For example, the first semiconductor material (e.g., channel 106) may be silicon, and the second semiconductor material (e.g., sacrificial) may be silicon germanium. The semiconductor materials and may each be formed by an epitaxial process, such as, for example, a molecular beam epitaxy (MBE) process, a CVD process, and/or other suitable epitaxial growth processes.

The process of forming the first type semiconductor material and the second type semiconductor material may be repeated until the desired number of layers are reached. Then, the channel stacks may be patterned into fin structures. Each fin may thus be a fin stack of alternating semiconductor layers.

After the desired number of semiconductor layers has been achieved and the fin structure patterned, a dummy gate structure that will eventually be replaced with a real metal or conductive gate may be formed on top of the fin structure.

While the dummy gate structure is formed over the channel region of the fin structure, a patterning process is then used to form recesses within the semiconductor layers in the regions where the source and drain structures 110 are to be formed. The patterning process may include a photolithographic process. For example, a hard mask layer and/or a photoresist layer may be deposited upon the workpiece. The hardmask layer may include at least one of silicon oxide (SiO2), silicon nitride (SiN), silicon carbide (SiC), silicon oxynitride (SiON), silicon oxycarbide (SiOCN), hafnium oxide (HfO2), aluminum oxide (Al2O3), and zirconium oxide (ZrO2).

Then, the photoresist layer may be exposed to a light source through a photomask. The photoresist may then be developed. Then, an etching process may be applied to transfer the pattern in the photoresist to the hard mask layer. After this process, the hard mask exposes portions of the alternating set of layers in the source/drain region. Then, an etching process such as a dry etching process is used to form recesses in the source/drain region.

In some implementations, a lateral etching process is then used to partially remove the sacrificial semiconductor layers exposed by the source/drain recesses where the inner spacers 108 are to be formed. The lateral etching process may be, for example, a wet etching process.

The etching process may be designed to be selective so as to remove the sacrificial semiconductor layer without substantially affecting the semiconductor layer providing the channel 106. For example, in the case where the sacrificial semiconductor layer is silicon germanium and the semiconductor layer providing the channel layer 106 is silicon, then the etching process may be configured to remove silicon germanium without substantially affecting silicon.

Then, a deposition process is applied to form the inner spacers 108. Specifically, the inner spacer layer is formed by a conformal deposition process so that the inner spacer layer is formed along sidewalls of the recesses where the source or drain structures 110 are to be formed. The inner spacer layer may be a dielectric material such as SiCN, SiOCN, or SiON.

An etch back process may then be used to remove portions of the inner spacer layer and to expose the channel layers 106. The etch back process also removes the inner spacer layer from the floor of the recesses and the top of the workpiece. The remaining portions of the inner spacer layers serve to electrically isolate the portions of the gate structure 104 with the source and drain regions to be formed. In some examples, the remaining inner spacer layer may vary within a range of width between about 4-15 nanometers.

In some implementations, one of the terminals, the source or drain, is to be interconnected by a backside contact. To provide for the backside contact, during the recessing discussed above and prior to growing the source/drain features contact, the source/drain region at the terminal to be contacted by the backside is recessed further recessed. In particular, to form the backside contact, the trench where the source/drain region is formed is further etched to create a deeper trench. This etching process may extend the depth of the recess another 45-65 nanometers. Then, the dummy contact structure 112 may be formed at the bottom of the trench. This may be done using an epitaxial growth process. The dummy contact structure may be, for example, made of silicon germanium without dopants. In some examples, the ratio of germanium to silicon in the silicon germanium may be within a range of about 30-40 percent.

In some implementations, after the dummy contact structure 112 is formed, then the source/drain structures 110 are formed. In some examples, the source and drain structures 110 are created by performing an epitaxial growth process. An epitaxial growth process involves forming a crystal structure on a crystal substrate. In the present example, the source and drain regions 110 are grown from the substrate 102 and channel regions 106. In some examples, the source and drain regions 110 may be doped in situ so as to obtain the desired properties.

After formation of the source/drain features, dielectric layer 107 such as a contact etch stop layer (CESL) and/or inter-layer dielectric (ILD) are formed over the source/drain features 110. Example compositions of the dielectric layer 107 may include dielectric materials including, for example, silicon oxide, carbon doped silicon oxide, silicon nitride, silicon oxynitride, TEOS-formed oxide, PSG, BSG, BPSG, FSG, xerogel, aerogel, amorphous fluorinated carbon, parylene, BCB-based dielectric material, polyimide, other suitable dielectric material, or combinations thereof. Dielectric layer 107 may be a multi-layer structure. Planarization of the dielectric layer 107 allows for exposure and subsequent removal of the dummy gate structure. After the source/drain structures 110 are formed and the dielectric layer 107 formed, the channel layers 106 may be released and the dummy gate structure may be replaced with a real gate 104. The release of the channel layers 106 may be done by removing the sacrificial semiconductor layers discussed above by a suitable selective etching process. The selective etching process may be a wet etch selective in its removal of the sacrificial semiconductor layers leaving the channel layers 106 substantially intact. The wet etching process may using an acid-based etchant such as: sulfuric acid ($H_2SO_4$), perchloric acid ($HClO_4$), hydroiodic acid (HI), hydrobromic acid (HBr), nitric acid ($HNO_3$), hydrochloric acid (HCl), acetic acid ($CH_3COOH$), citric acid ($C_6H_8O_7$), potassium periodate ($KIO_4$), tartaric acid ($C_4H_6O_6$), benzoic acid ($C_6H_5COOH$), tetrafluoroboric acid ($HBF_4$), carbonic acid ($H_2CO_3$), hydrogen cyanide (HCN), nitrous acid ($HNO_2$), hydrofluoric acid (HF), or phosphoric acid ($H_3PO_4$). In some examples, an alkaline-based etchant may be used. Such etchants may include but are not limited to ammonium hydroxide ($NH_4OH$) and potassium hydroxide (KOH). By removing the sacrificial semiconductor layers, the channel layers 106 thus become nanostructures extending between source and drain structures 110.

After the dummy gate structure is removed and the channel layers 106 released, a real or functional gate structure 104 is formed. Formation of the real gate device may include a number of steps. For example, a high-k dielectric layer may be deposited so as to surround the channel layers 106. The high-k dielectric layer may include, for example, aluminum oxide, hafnium oxide, zirconium oxide, hafnium aluminum oxide, or hafnium silicon oxide. Other materials may be used as well. For example, other materials with a dielectric constant greater than 7 may be used.

In some examples, depending on the type of transistor device being formed, a work function layer is provided over the gate dielectric layer in the gate structure 104. Such metal or metals is designed to metal gates the desired properties for ideal functionality. Various examples of a p-type workfunction metal may include, but are not limited to, tungsten carbon nitride (WCN), tantalum nitride (TaN), titanium nitride (TiN), titanium aluminum nitride (TiAlN), tungsten sulfur nitride (TSN), tungsten (W), cobalt (Co), molybdenum (Mo), etc. Various examples of n-type workfunction metals include, but are not limited to, aluminum (Al), titanium aluminum (TiAl), titanium aluminum carbide (TiAlC), titanium aluminum silicon carbide (TiAlSiC), tantalum aluminum silicon carbide (TaAlSiC), and hafnium carbide (HfC). A gate fill layer may by disposed over the work function material(s). The gate fill layer may be a conductive material such as a metal material.

In this manner, the gate structure 104 entirely surrounds each of the channel layers 106. In some cases, after the source and drain structures and the gate structure have been formed various multi-layer interconnect structures (MLI, not shown) of the back-end-on-the-line (BEOL) processing may be formed on the frontside of the device that includes various horizontally extending metallization lines (not shown) and vertically-extending vias. The MLI may include contact structures 105 extending through the ILD 107 to one of the source/drain features 110, for example, the source/drain feature 110 to which a backside contact is not made. The MLI may further include a contact feature extending to the gate structure 104.

Figure 1B:
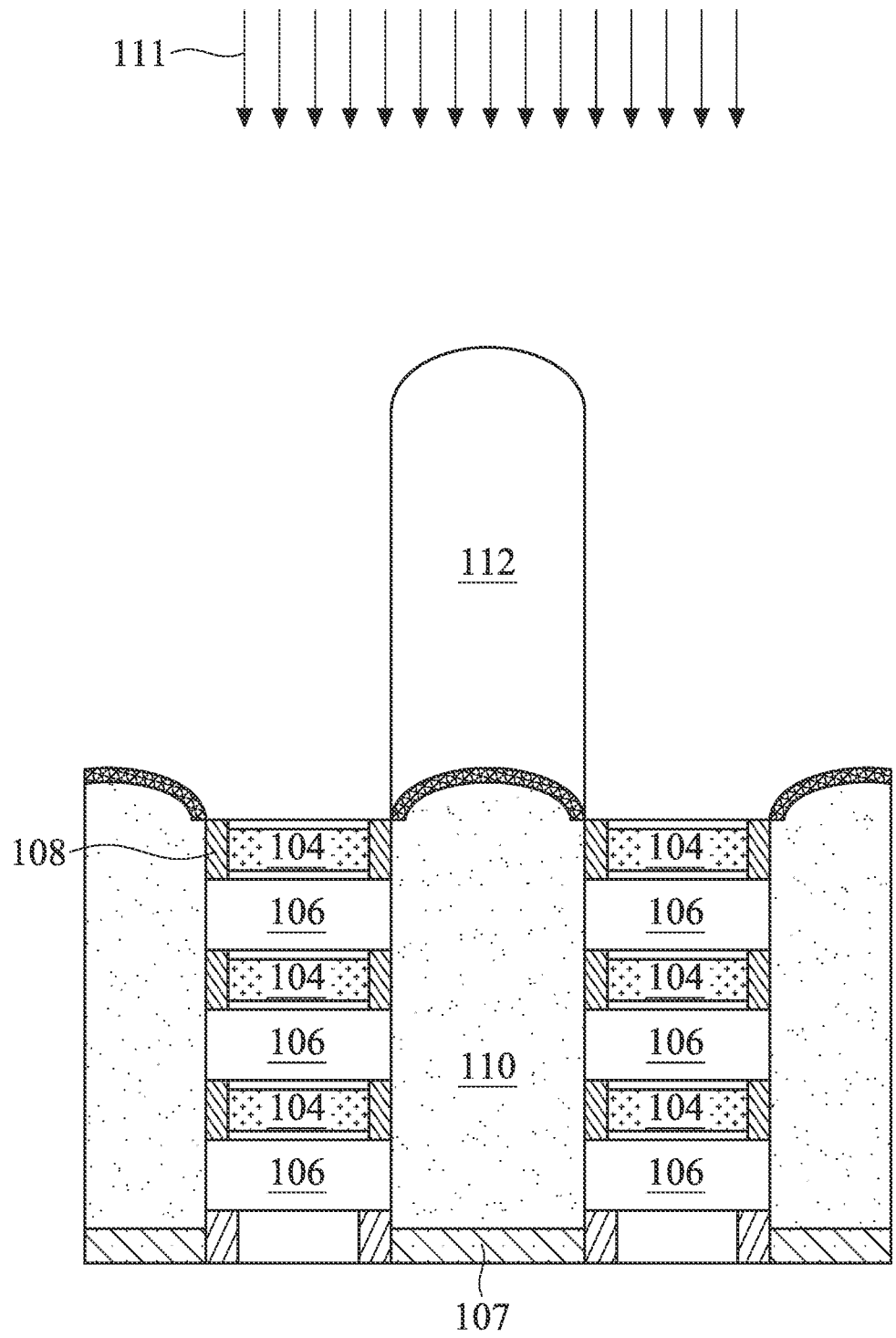

After BEOL processing to form a MLI, or portion thereof, over the frontside of the device, FIG. 1B illustrates the BEOL process to form an enlarged backside contact. To do this, a removal process 111 is applied to the backside of the workpiece to remove the backside portion of the substrate 102 and expose the dummy contact structure 112. This removal process may be, for example, a wet etching process. The wet etching process may be selective so as to remove the semiconductor substrate 102 while leaving the dummy source contact structure 112, the gate structure 104, and the source/drain feature 110 substantially intact.

Figure 1C:
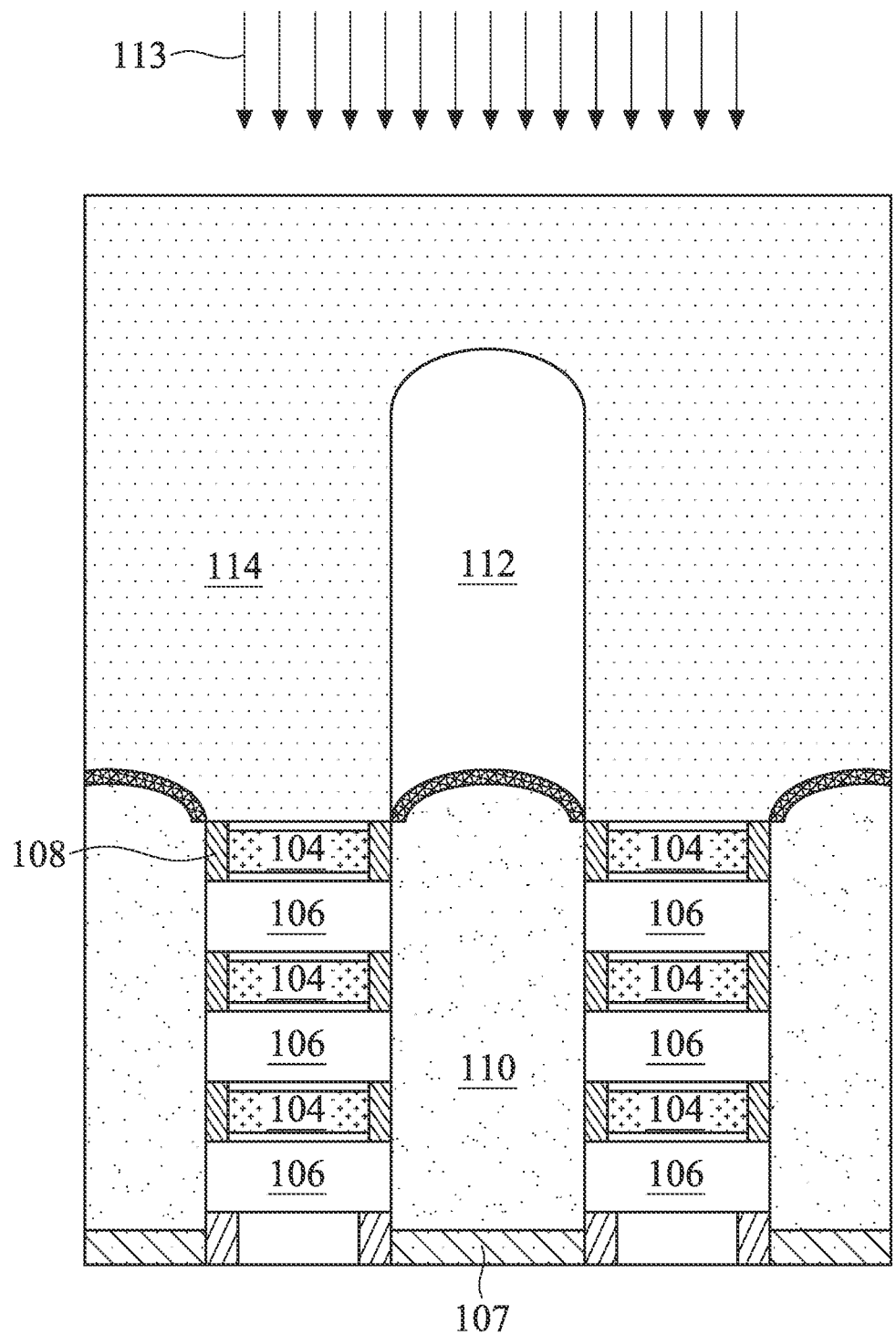

FIG. 1C illustrates a formation process 113 to form a dielectric layer 114 surrounding the dummy contact structure 112. The dielectric layer 114 may be, for example, an interlayer dielectric layer (ILD). The dielectric layer 114 may be formed using a deposition process such as atomic layer deposition (ALD), or chemical vapor deposition (CVD). The dielectric layer 114 may be an oxide layer.

Figure 1D:
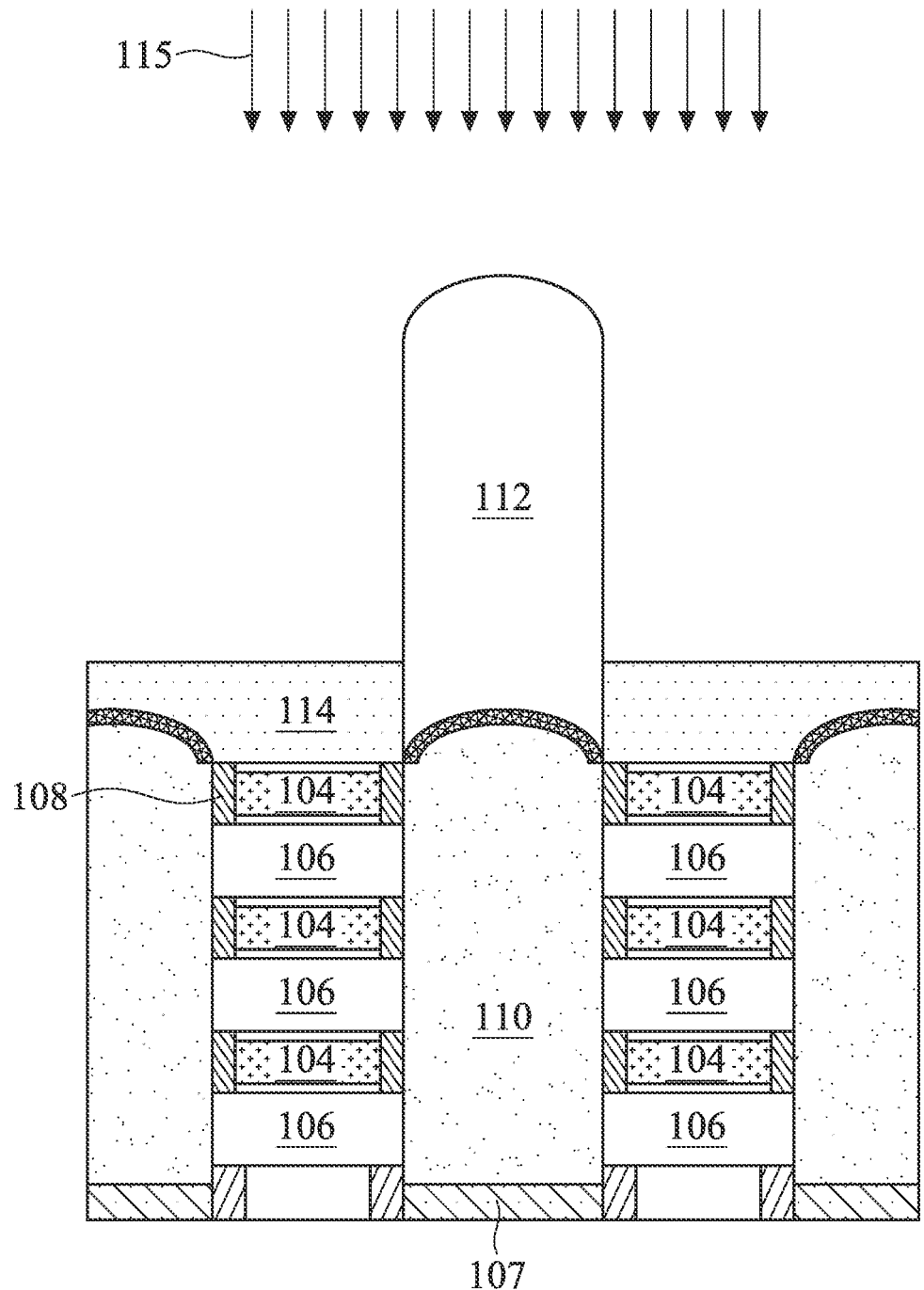

FIG. 1D illustrates a partial etch-back process 115 by which the dielectric layer is partially etched back. This may be done by applying a selective etching process so that the dielectric layer 114 is partially removed while the dummy contact structure 112 remains intact. The etch-back process 115 may be an anisotropic etching process such as a dry-etching process. The thickness of the remaining dielectric layer 114 may be within a range of about 5-40 nm between the top surface of the dielectric layer 114 and the top surface of the gate structure 104, and about 2-10 nm between the top surface of the dielectric layer 114 and the top surface of a source/drain feature. This distance controls for the distance between the plug and the gate layer 104 to ensure good functionality.

Figure 1E:
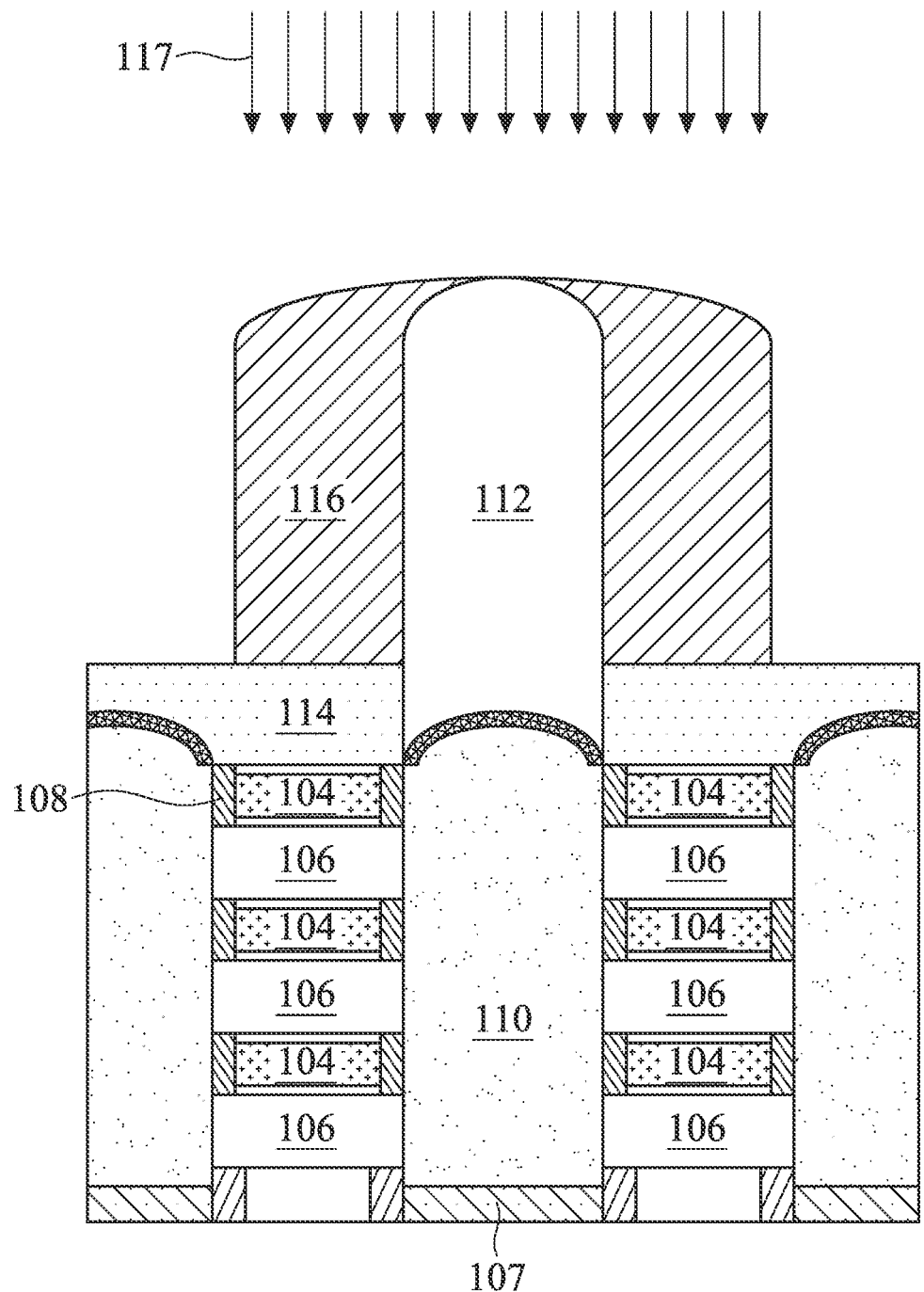
Figure 3A:
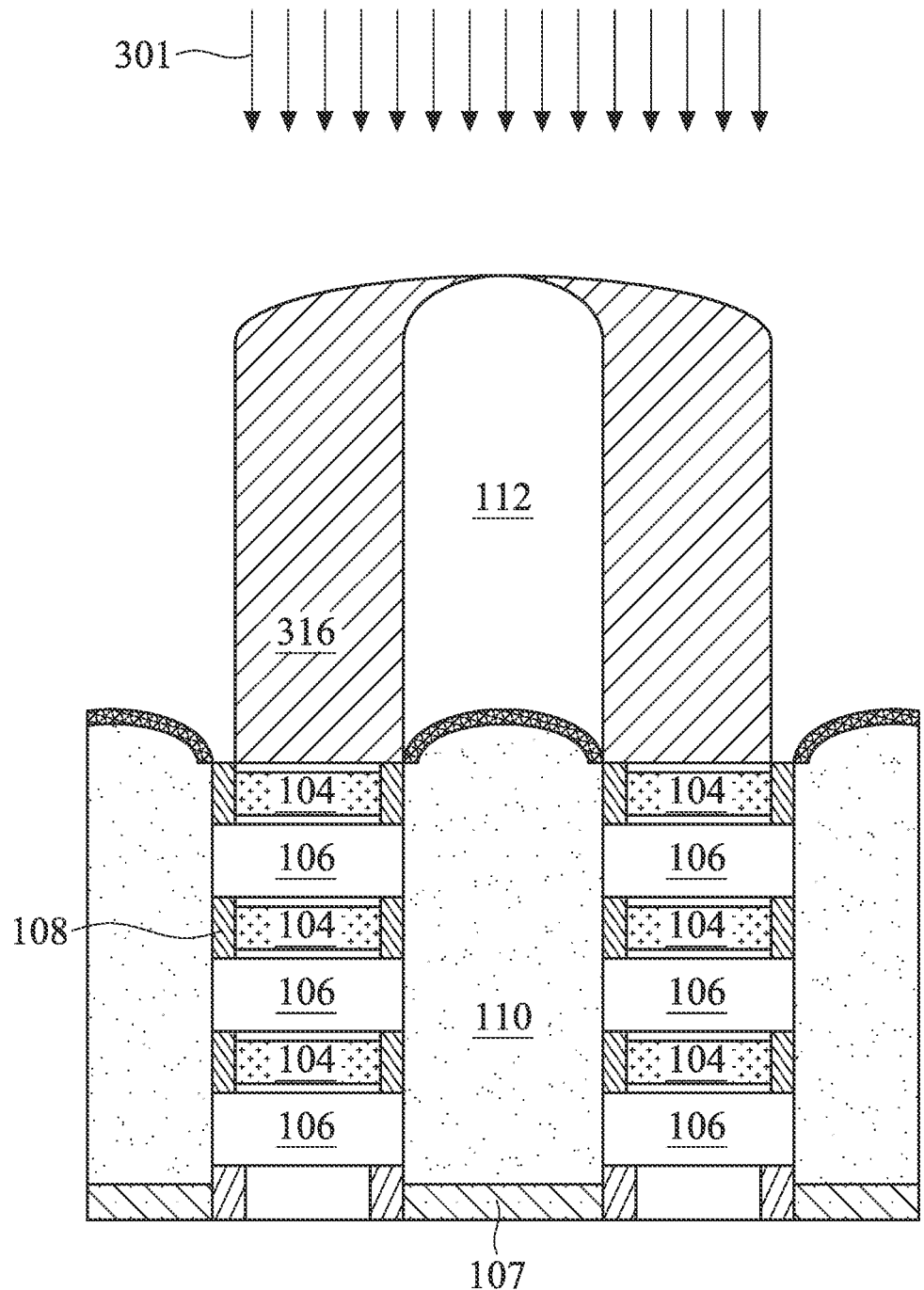
FIGS. 3A, 3B, 3C, 3D, 3E, and 3F are diagrams showing an illustrative process for forming an enlarged backside contact with a substantially similar width, according to one example of principles described herein.

FIG. 1E illustrates a deposition process 117 to form a spacer layer 116 around the dummy contact structure 112. The spacer layer 116 may be formed in a conformal process such as ALD or CVD. After conformal deposition, the spacer layer material may be etched back to provide spacer layer 116, which is removed from a top surface of the dummy contact structure 112. In some examples, the spacer layer 116 may be made of the same material as the dummy contact structure 112. However, in some examples, the spacer layer 116 may be a different material than the dummy contact structure 112. In some implementations, the spacer material 116 is a material that has etching selectivity to the high-k dielectric and interfacial layers of the gate structures 104 (see the discussion below with reference to FIG. 3A). In some implementations, the spacer material 116 is a material that has etching selectivity to the dielectric layer 114. In one example, the spacer layer includes silicon nitride or silicon germanium. The spacer layer may have a thickness of about 5-20 nanometers and a height of about 10-45 nanometers. This enlarges the dimension of the plug while controlling for plug-to-plug distance.

Figure 1F:
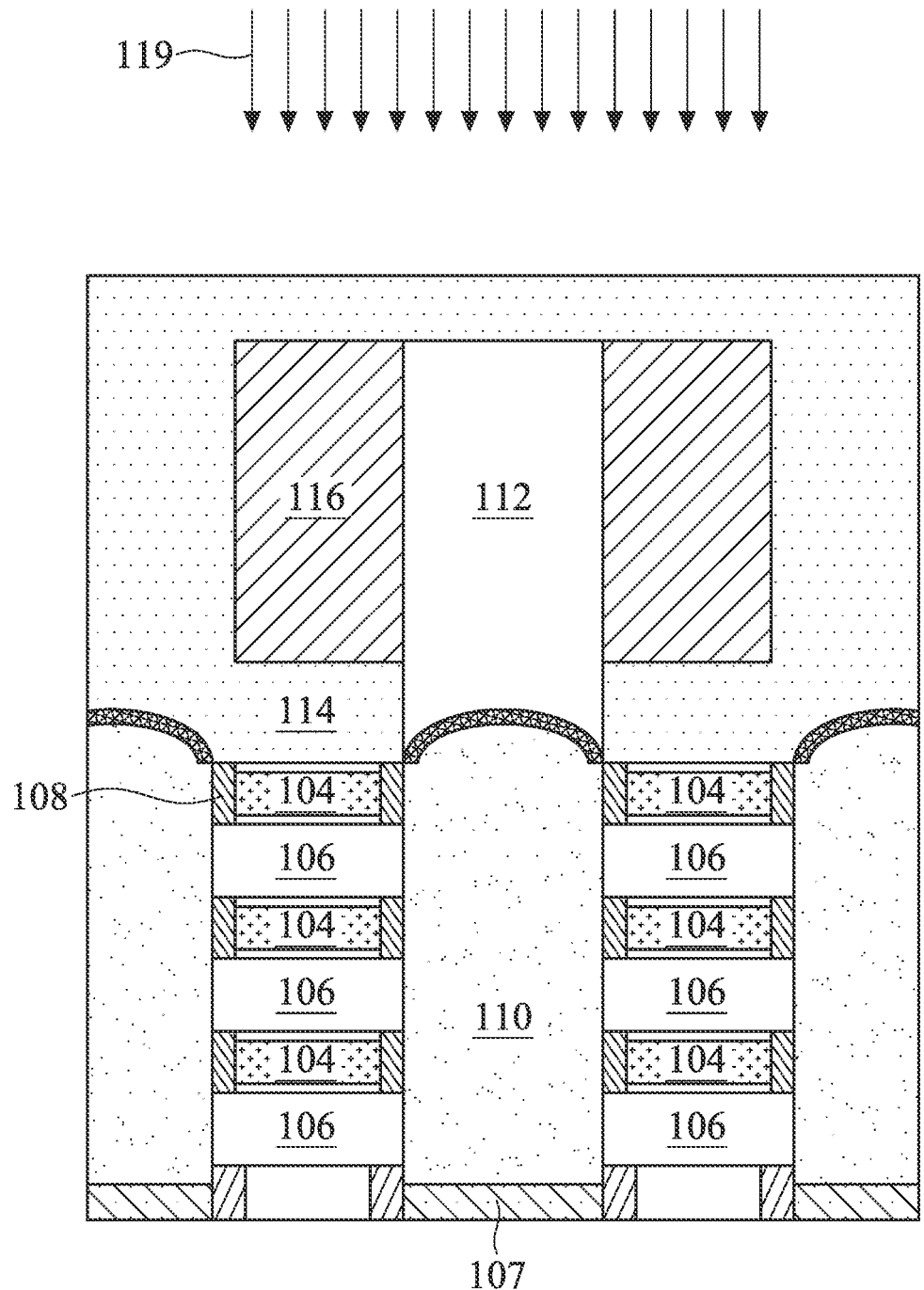

FIG. 1F illustrates a process 119 by which additional dielectric layer 114 is formed to cover the spacer layer 116 and the dummy contact structure 112. This may be done, for example, by a deposition process.

Figure 1G:
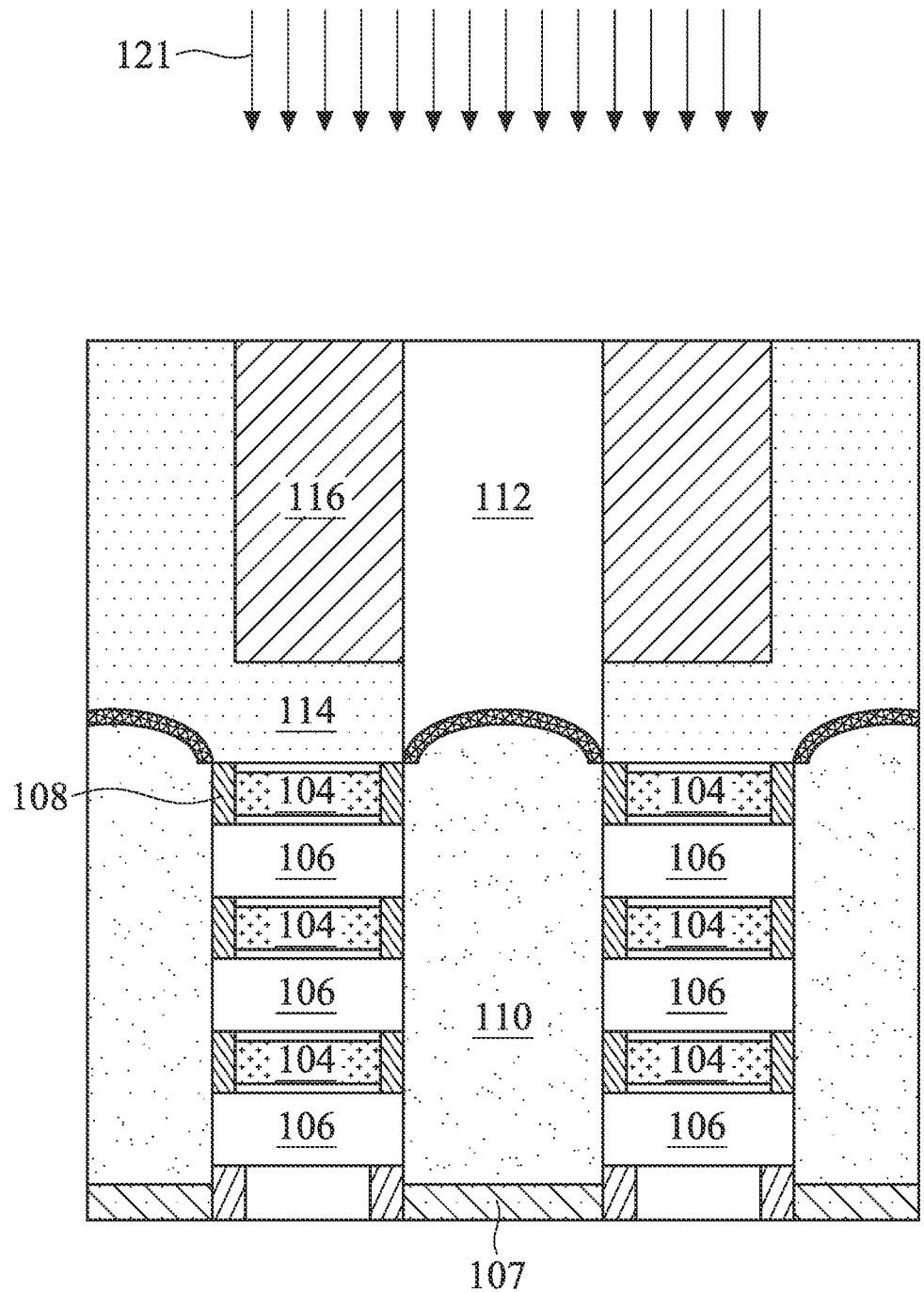

FIG. 1G illustrates a process 121 by which a Chemical Mechanical Polishing (CMP) process 121 is applied to the surface of the workpiece to expose the spacer layer 116.

Figure 1H:
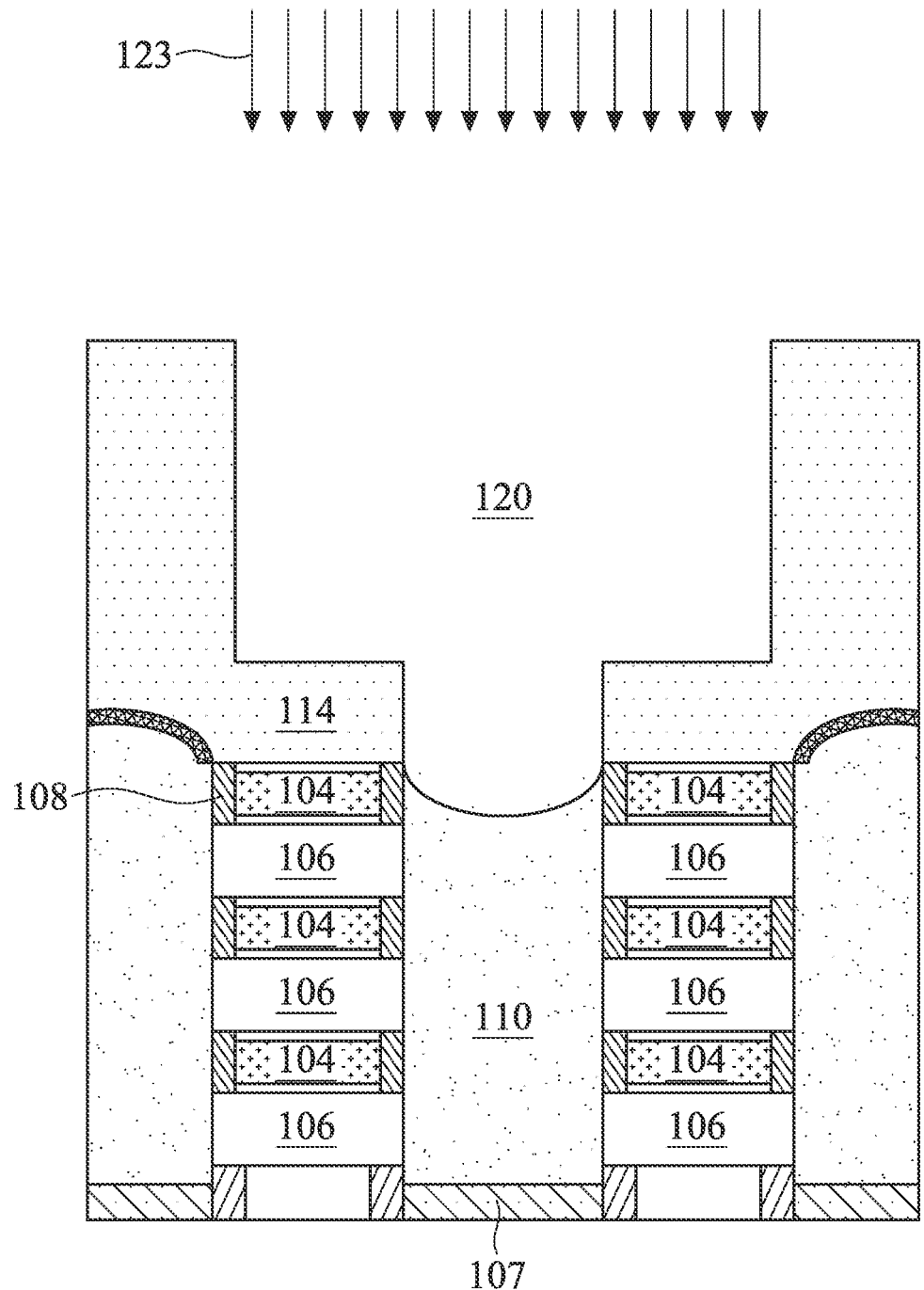

FIG. 1H illustrates a removal process 123 by which the spacer layer 116 and the dummy contact structure 112 are removed. In some examples, the removal process 123 may be a single etching process to remove both the spacer layer 116 and the dummy contact structure 112, such as the case where both are the same material. In some examples, the removal process 123 may include separate etching processes to remove the spacer layer 116 and the dummy contact structure 112, such as in the case where they are different materials. The etching process may be selective so as to remove the dummy contact structure 112 and/or the spacer layer 116 while leaving the dielectric layer 114, source/drain feature 110, and gate structures 104 substantially intact. The removal process 123 leaves an opening 120.

Figure 1I:
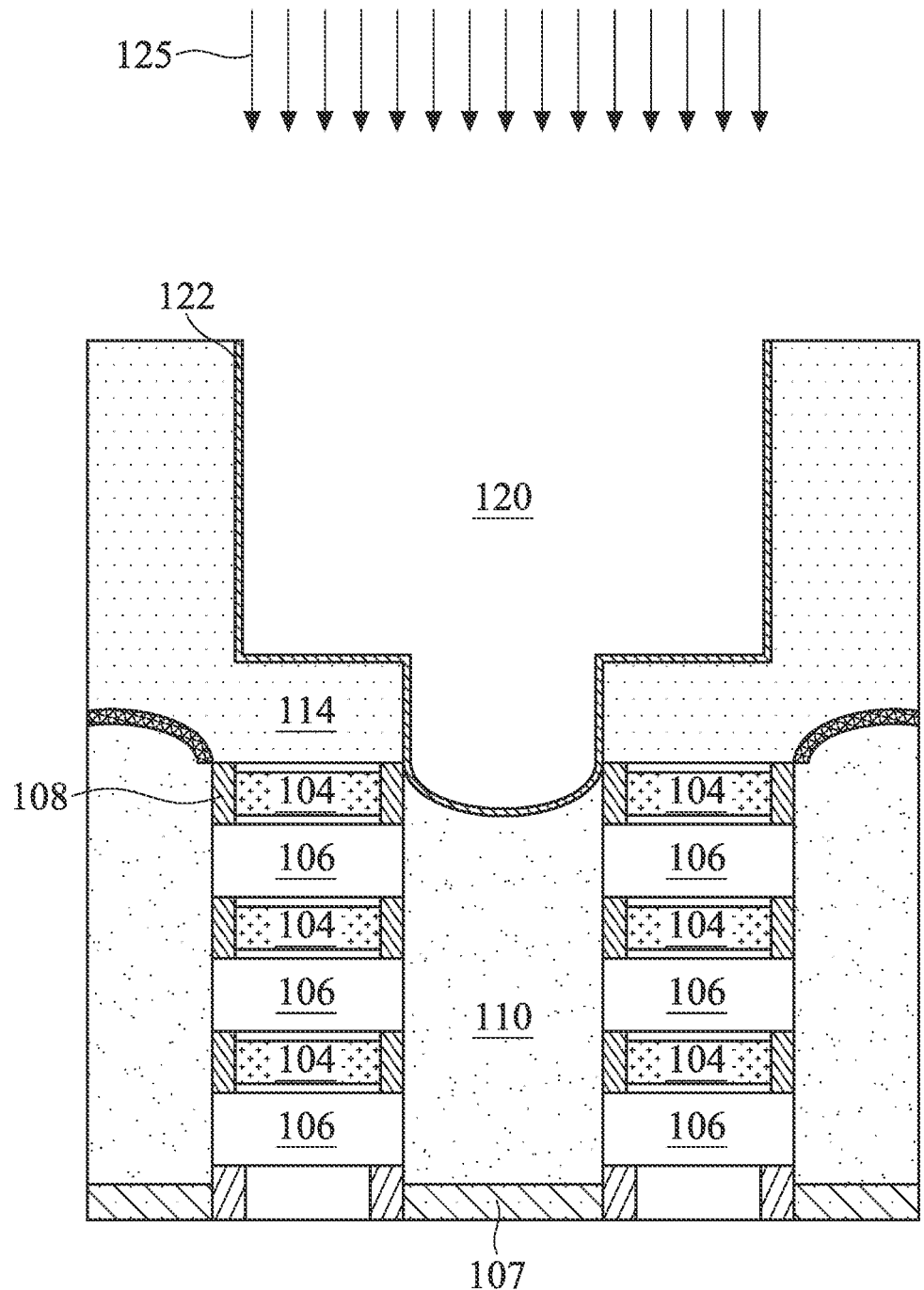

FIG. 1I illustrates a deposition process 125 by which a nitride layer 122, such as silicon nitride, is deposited along sidewalls of the opening 120. The nitride layer may reduce diffusion of the conductive material that is to be formed in the opening 120 onto the dielectric layer 114. The nitride layer 122 may be formed via an ALD or CVD process. In an embodiment, the nitride layer 122 is conformally deposited and subsequently removed from a bottom of the opening 120. The nitride layer 122 deposition process may be tuned so that more nitride is deposited in the upper regions so that during an etching process, the nitride at the bottom adjacent the source/drain 110 is removed while the nitride on the sidewalls remains. In other embodiments, the nitride layer 122 may be omitted.

Figure 1J:
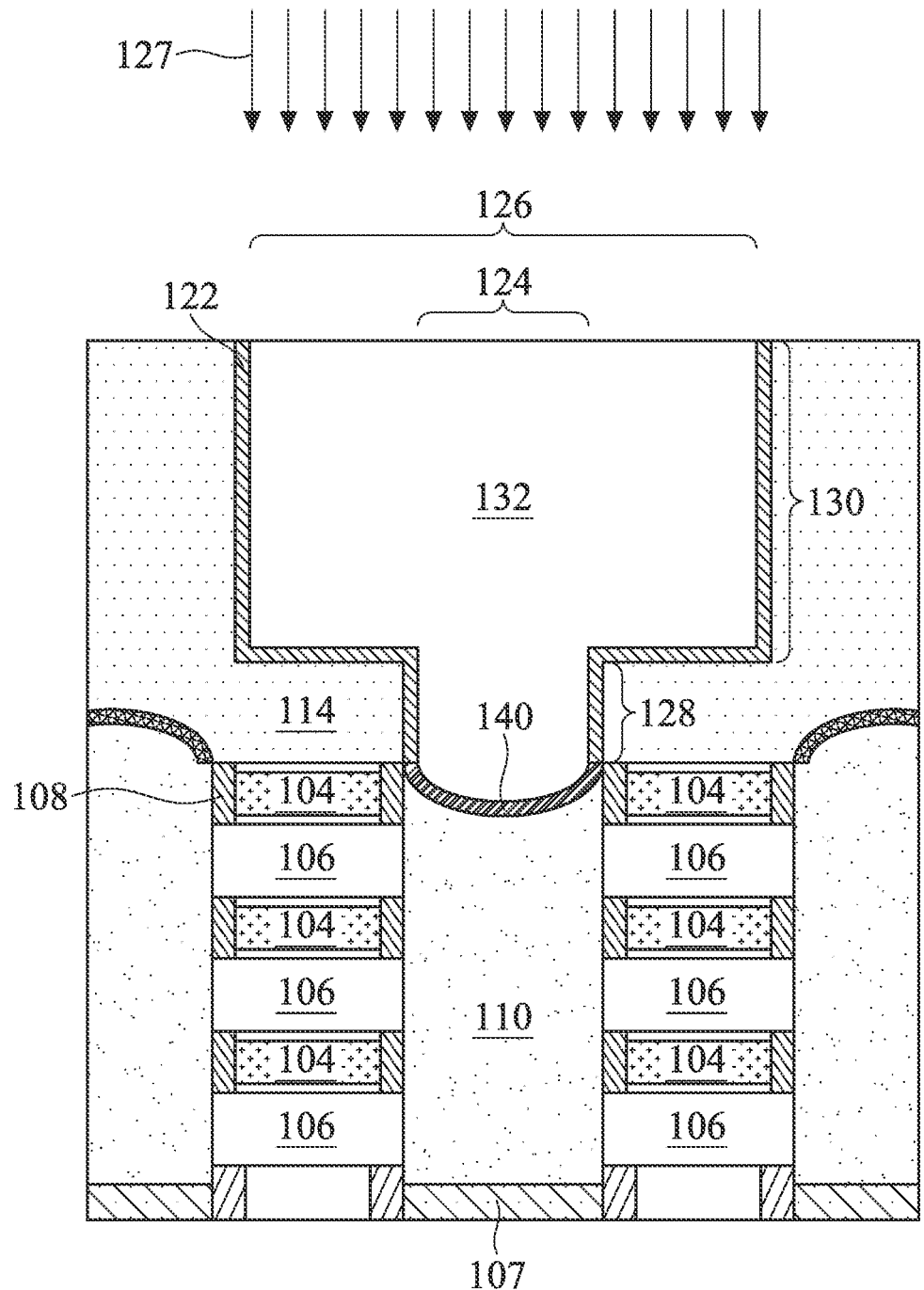

FIG. 1J illustrates a process 127 by which the functional backside contact 132 is formed. The functional backside contact 132 may be formed by depositing a conductive material such as a metal material(s) into the opening 120 and then performing a CMP process on the workpiece. In some examples, a silicide layer 140 may be formed at the junction between the backside contact 132 and the source/drain region 110 by a silicidation process through the interaction of silicon of the source/drain feature 110 and the metal material(s) of the contact 132. Because the spacer material 116 created a larger spaced opening 120, the backside contact 132 is larger than it otherwise would be. Specifically, it is larger than it would be if only the dummy contract structure 112 were replaced.

In the present example, the backside contact 132 includes a lower portion 128 and an upper portion 130. The lower portions 128 has a smaller width 124 than the width 126 of the upper portion 130. The width 124 of the lower portion 128 is also substantially similar to the width of the source/drain structure 110. The width of the lower, narrower portion 128 may be within a range of about 10-20 nanometers. The width of the upper, wider portion 130 may be within a range of about 12-44 nanometers. In some implementations, the ratio of the width 124 of the lower portion 128 to the width 128 of the upper portion 130 is between approximately 1:1.2 to 1:5.

Figure 2:
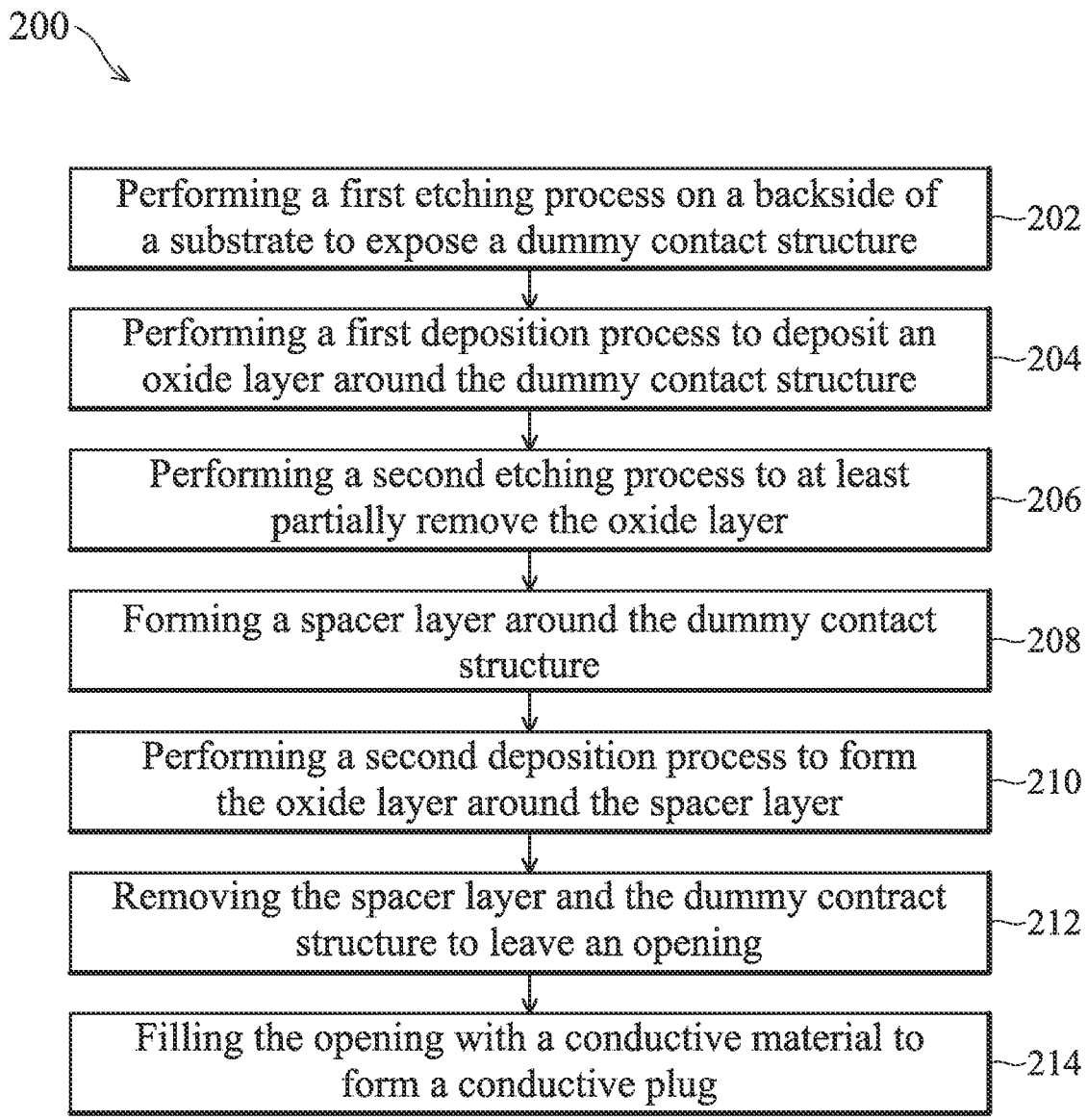
FIG. 2 is a flowchart showing an illustrative method for forming an enlarged backside contact with a wider portion and a narrower portion, according to one example of principles described herein.

FIG. 2 is a flowchart showing an illustrative method for forming an enlarged backside contact with a wider portion and a narrower portion substantially similar to as discussed above with reference to FIGS. 1A-1J. According to the present example, the method 200 includes a process 202 for performing a first etching process (e.g., 111) on a backside of a substrate to expose a dummy contact structure (e.g., 112). This removal process may be, for example, a wet etching process. The wet etching process may be selective so as to remove the semiconductor substrate while leaving the dummy source contact structure substantially intact.

The method 200 further includes a process 204 for performing a first deposition process (e.g., 113) to deposit an oxide layer (e.g., 114) around the dummy contact structure. The oxide layer 114 may be formed using a deposition process such as atomic layer deposition (ALD), or chemical vapor deposition (CVD).

The method 200 further includes a process 206 for performing a second etching process (e.g., 115) to at least partially remove the oxide layer. This may be done by applying a selective etching process so that the oxide layer is partially removed while the dummy contact structure remains intact. The etch-back process may be an anisotropic etching process such as a dry-etching process.

The method 200 further includes a process 208 for forming (e.g., 117) a spacer layer (e.g., 116) around the dummy contact structure. The spacer layer may be formed in a conformal process such as ALD or CVD. In some examples, the spacer layer may be made of the same material as the dummy contact structure. However, in some examples, the spacer layer may be a different material than the dummy contact structure. The spacer material may be a material that has etching selectivity to the high-k dielectric and interfacial layers surrounding the gate structures, as well as to the oxide layer. In one example, the spacer layer includes silicon nitride or silicon germanium.

The method 200 further includes a process 210 for performing a second deposition process (e.g., 119) to form the oxide layer around the spacer layer. This may be done, for example, by a deposition process.

The method 200 further includes a process 212 for removing (e.g., 123) the spacer layer and the dummy contract structure to leave an opening (e.g., 120). In some examples, the removal process may be a single etching process to remove both the spacer layer and the dummy contact structure, such as the case where both are the same material. In some examples, the removal process may include separate etching processes to remove the spacer layer and the dummy contact structure, such as in the case where they are different materials. The etching process may be selective so as to remove the dummy contact structure while leaving the oxide layer and gate structures substantially intact.

The method 200 further includes a process 214 for filling (e.g., 127) the opening with a conductive material to form a conductive plug (e.g., 132). The conductive plug thus serves as a backside contact. The conductive plug may be formed by depositing a conductive material such as a metal material into the opening and then performing a CMP process on the workpiece. Because the spacer material created a larger spaced opening, the conductive plug is larger than it otherwise would be. Specifically, it is larger than it would be if only the dummy contract structure were replaced.

FIGS. 3A, 3B, 3C, 3D, 3E, and 3F are diagrams showing an illustrative process for forming an enlarged backside contact with a substantially constant width. FIGS. 3A, 3B, 3C, 3D, 3E, and 3F may be substantially similar to as discussed above with reference to FIGS. 1A, 1B, 1C, 1D, 1E, 1F, 1G, 1H, 1I, and 1J, with differences noted herein. According to the present example, after the substrate 102 has been removed from the backside of the workpiece as shown in FIG. 1B, a spacer layer 316 is formed in process 301 around the exposed dummy contact structure 112. The spacer layer 316 may be substantially similar to the spacer layer 116. This example differs from the example above in that there is not a residual oxide layer (e.g., etched back oxide layer) disposed before the spacer layer is deposited. The spacer layer 316 may be formed in a conformal process such as ALD or CVD. In some examples, the spacer layer 316 may be made of the same material as the dummy contact structure 112. However, in some examples, the spacer layer 316 may be a different material than the dummy contact structure 112. The spacer material 316 is a material that has etching selectivity to the high-k dielectric and interfacial layers of the gate structures 104. In one example, the spacer layer 316 includes silicon nitride or silicon germanium. The spacer layer may have a thickness within a range of about 5-20 nm and a height within a range of about 35-60 nm. This enlarges the plug dimension while controlling for plug-to-plug width.

Figure 3B:
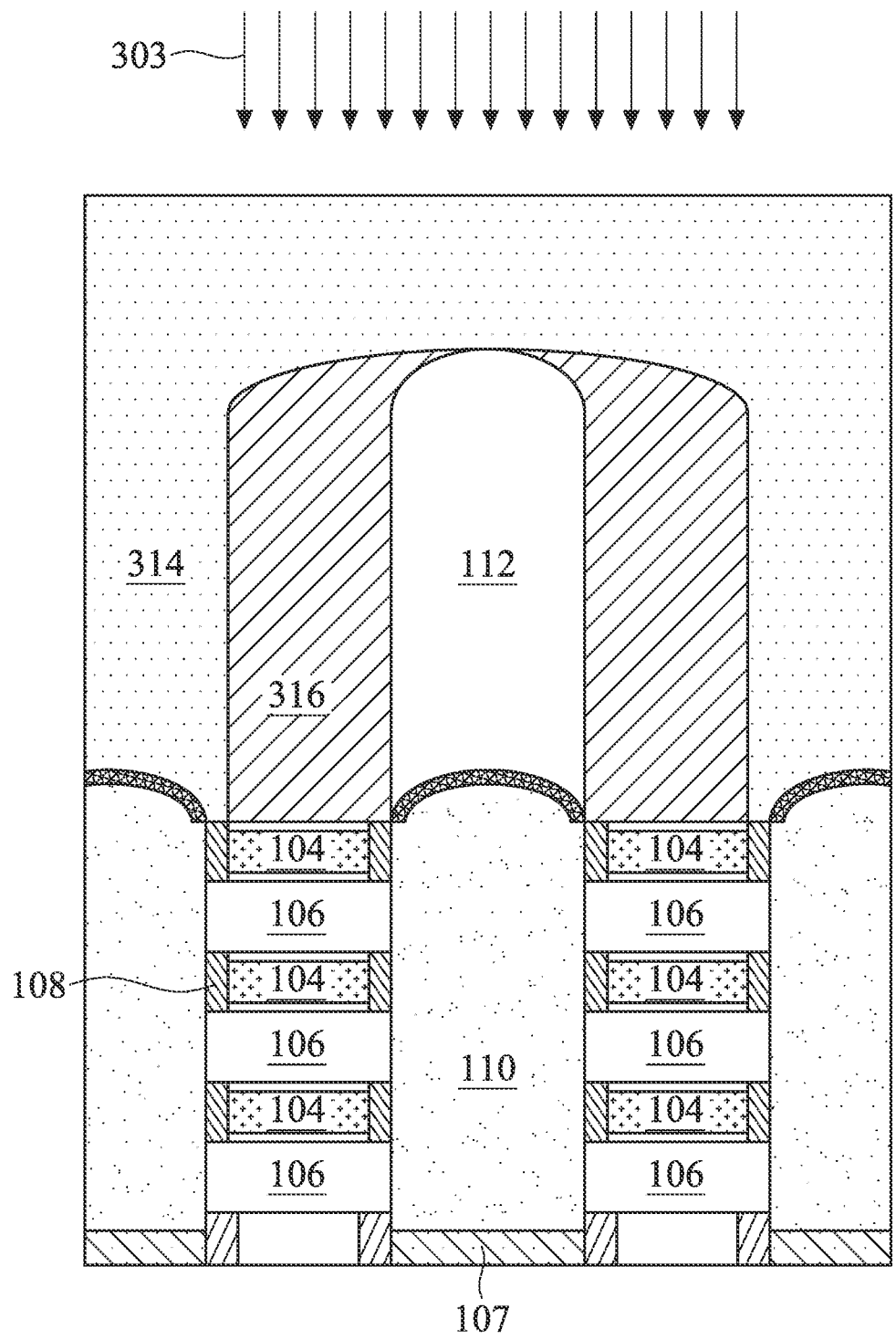

FIG. 3B illustrates a process 303 by which a dielectric layer 314 such as an oxide layer is formed around the spacer layer 316. The dielectric layer 314 may be, for example, an interlayer dielectric layer (ILD). The dielectric layer 314 may be formed using a deposition process such as atomic layer deposition (ALD), or chemical vapor deposition (CVD). The dielectric layer 314 may be substantially similar to the dielectric layer 114 discussed above.

Figure 3C:
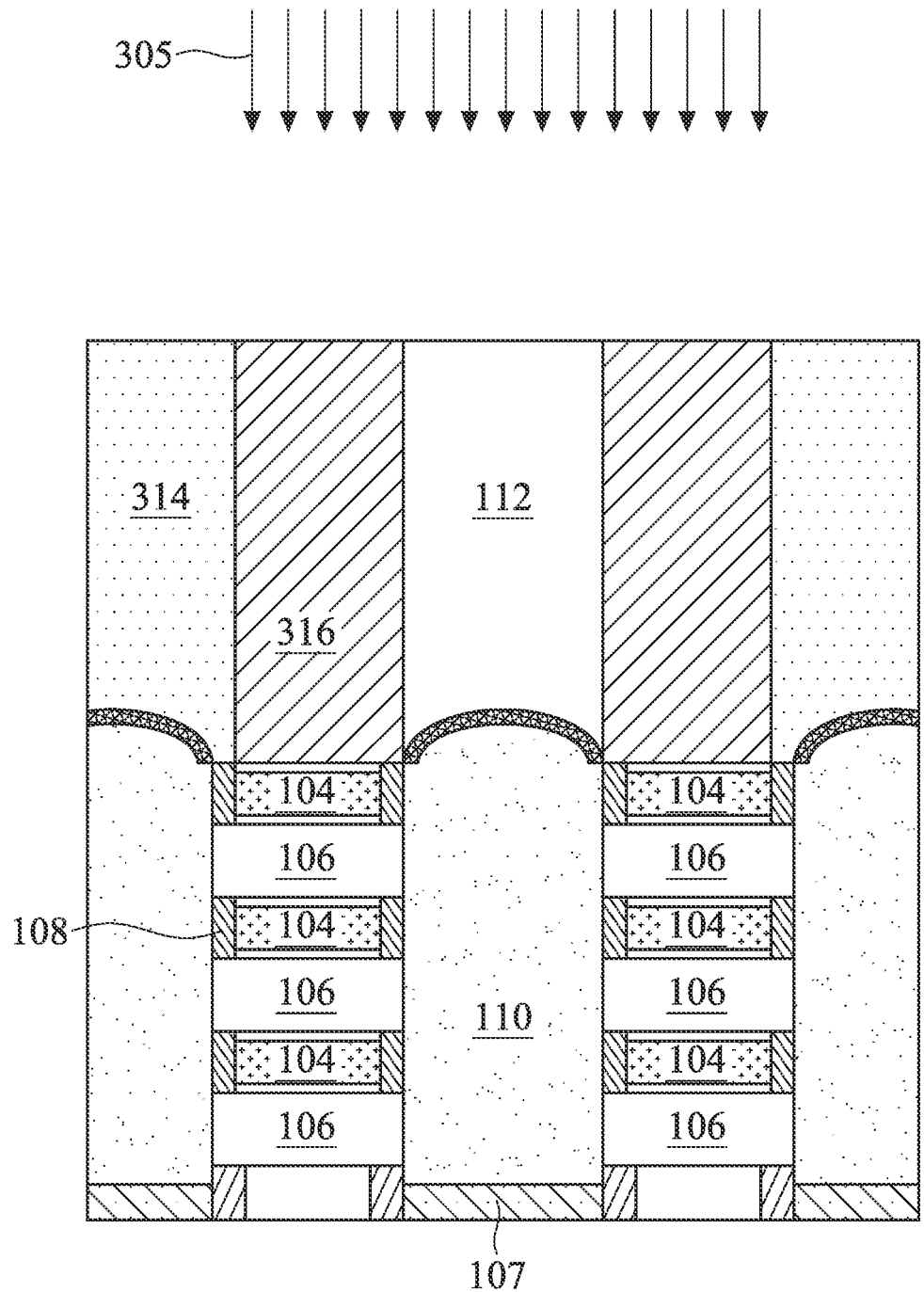

FIG. 3C illustrates a process 305 by which a Chemical Mechanical Polishing (CMP) process 305 is applied to the surface of the workpiece to expose the spacer layer 316.

Figure 3D:
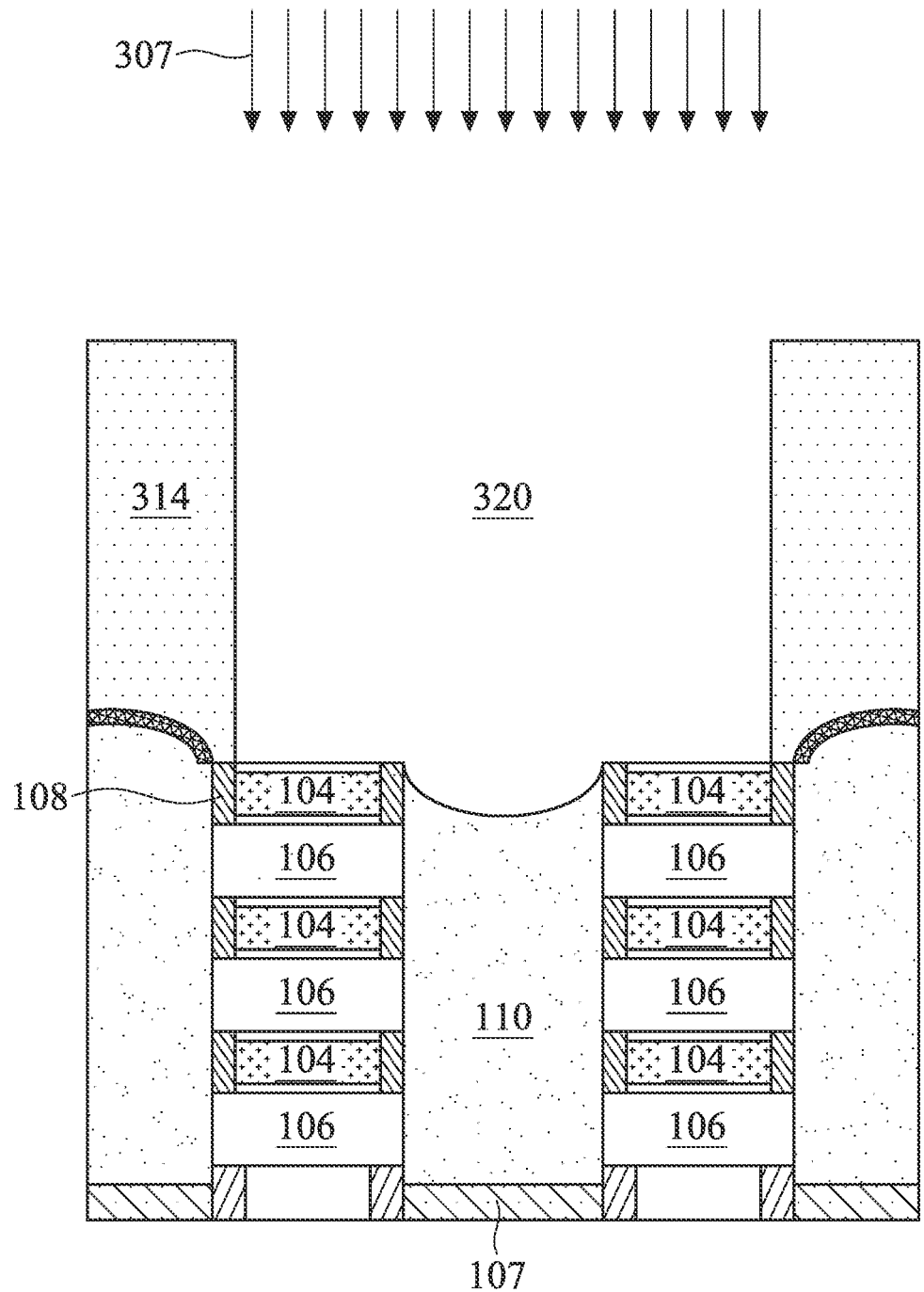

FIG. 3D illustrates a process 307 by which the spacer layer 316 and the dummy contact structure 112 are removed. In some examples, the removal process 307 may be a single etching process to remove both the spacer layer 316 and the dummy contact structure 112, such as the case where both are the same material. In some examples, the removal process 307 may include separate etching processes to remove the spacer layer 316 and the dummy contact structure, such as in the case where they are different materials. The etching process may be selective so as to remove the dummy contact structure 112 and/or the spacer layer 316, while leaving the dielectric layer 314, source/drain features 110, and gate structures 104 substantially intact. The removal process 307 leaves an opening 320. In some implementations, an over-etch of the source/drain feature 110 may provide a concave bottom surface of the opening 304 between the gate structures 104.

Figure 3E:
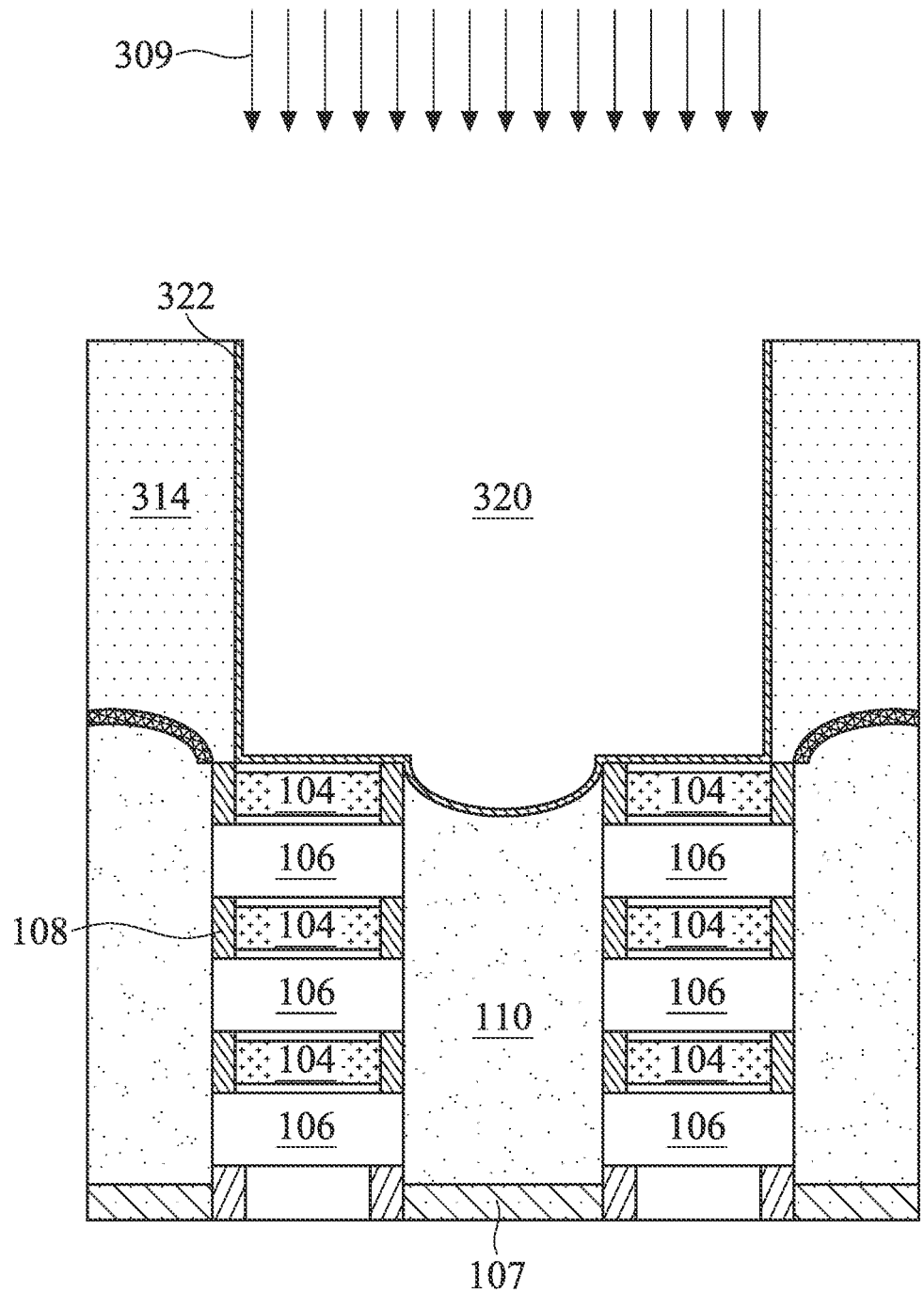

FIG. 3E illustrates a deposition process 309 by which a nitride layer 322, which may be silicon nitride, is deposited along sidewalls of the opening 320. In some embodiments, the nitride layer 322 is conformally deposited and subsequently etched to remove the nitride layer 322 from the bottom of the opening 320 over the source/drain feature 110. The nitride layer may reduce diffusion of the conductive material that is to be formed in the opening into the dielectric layer 314. The nitride layer 322 may be formed via an ALD or CVD process.

Figure 3F:
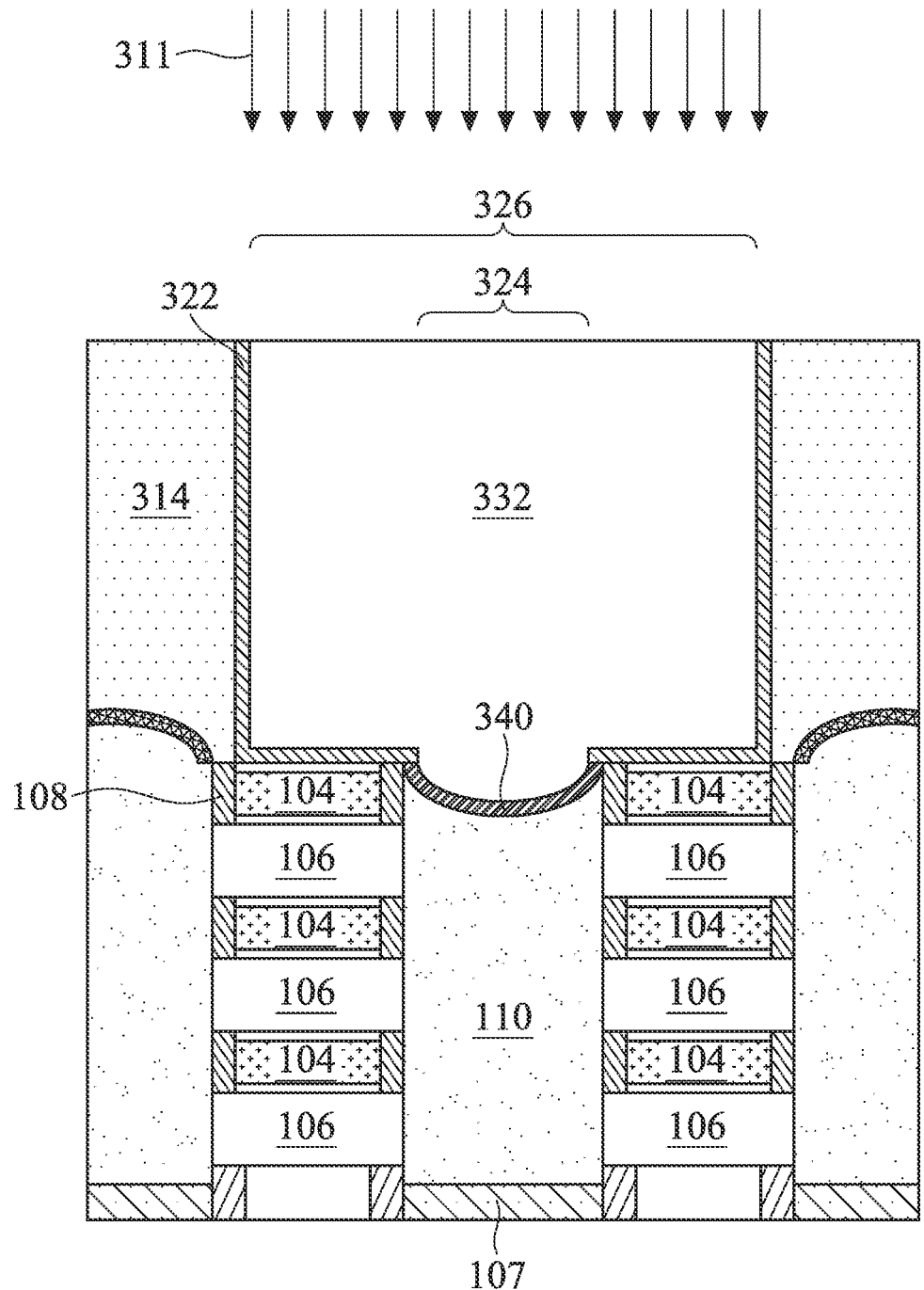

FIG. 3F illustrates a process 311 by which the functional backside contact 332 is formed. The functional backside contact 332 may be formed by depositing a conductive material such as a metal material into the opening 320 and then performing a CMP process on the workpiece. In some examples, a silicide layer 340 may be formed at the junction between the backside contact 332 and the source/drain region 110 due to silicidation process between silicon of the source/drain feature 110 and the metal of the contact 332.

Because the spacer material 316 created a larger spaced opening 320, the backside contact 332 is larger than it otherwise would be. Specifically, it is larger than it would be if only the dummy contract structure 112 were replaced. In the present example, the backside contact 332 has a width 326 that is larger than the width 324 of the source/drain structure 110 underneath. The width 326 may be within a range of about 12-44 nanometers. In an embodiment, the width 326 ratio to the width of the source/drain feature 110 is between approximately 1.1:1 and approximately 5:1.

Figure 4:
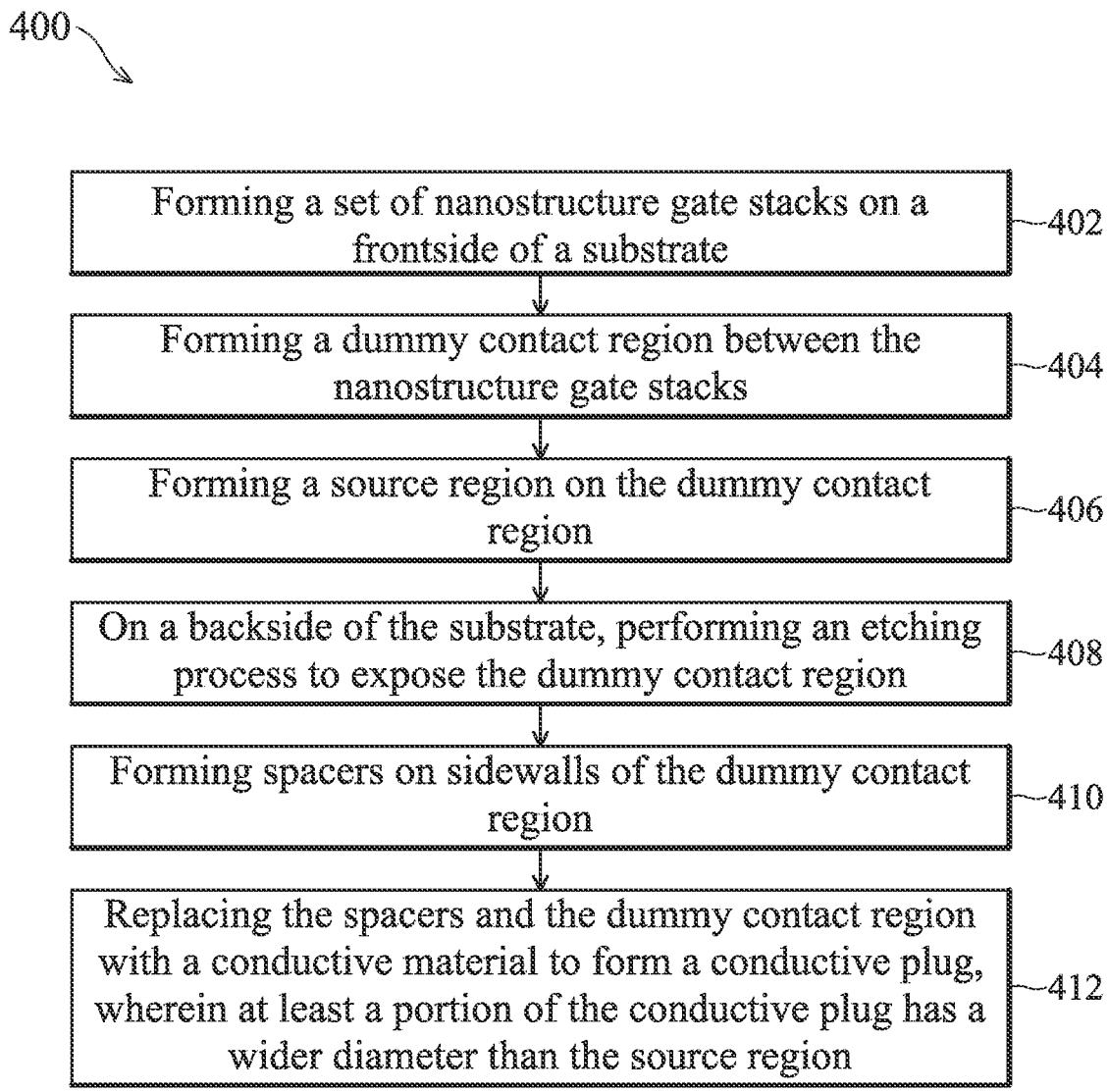
FIG. 4 is a flowchart showing an illustrative method for forming an enlarged backside contact with a substantially similar width, according to one example of principles described herein.

FIG. 4 is a flowchart showing an illustrative method for forming an enlarged backside contact with a substantially constant width. According to the present example, the method 400 includes a process 402 for forming a set of nanostructure gate stacks (e.g., 104, 106) on a frontside of a substrate (e.g., 102). The method further includes a process 404 for forming a dummy contact region (e.g., 112) between the nanostructure gate stacks. The method further includes a process 406 for forming a source region (e.g., 110) on the dummy contact region. The method further includes a process 408 for, on a backside of the substrate, performing an etching process to expose the dummy contact region. The method further includes a process 410 for forming spacers (e.g., 116, 316) on sidewalls of the dummy contact region. The method further includes a process 412 for replacing the spacers and the dummy contact region with a conductive material to form a conductive plug (e.g., 132, 332), wherein at least a portion of the conductive plug has a wider diameter than the source region. The method of FIG. 4 may include many additional steps including those discussed above and those not specifically discussed herein.

Thus, provided are devices and methods that allow for decreasing the contact resistance of a backside contact feature formed to a source/drain of a device. The devices and methods allow for increasing the width of the contact in whole or in part. While the device of FIG. 3F may provide an advantage of an increased width and thus, lower resistance, the device of FIG. 1J provides for a portion of increased width while maintaining protection of the gate structure (e.g., providing a separation between the gate structure 104 and the contact structure 132).

According to one example, a method includes performing a first etching process on a backside of a substrate to expose a dummy contact structure, performing a first deposition process to deposit a first portion of an oxide layer around the dummy contact structure, performing a second etching process to at least partially remove the first portion of oxide layer, forming a spacer layer around the dummy contact structure, performing a second deposition process to form a second portion of the oxide layer around the spacer layer, removing the spacer layer and the dummy contract structure to leave an opening, and filling the opening with a conductive material to form a conductive plug.

According to one example, a method includes forming a set of nanostructure channel regions on a frontside of a substrate, forming a dummy contact region between the nanostructure gate stacks, forming a source region on the dummy contact region, on a backside of the substrate, performing an etching process to expose the dummy contact region, forming spacers on sidewalls of the dummy contact region, and replacing the spacers and the dummy contact region with a conductive material to form a conductive plug, wherein at least a portion of the conductive plug has a wider diameter than the source region.

A semiconductor device includes a set of nanostructure stacks on a substrate, a source region positioned between the nanostructure stacks, a source contact extending from a bottom of the source region towards a backside of the substrate, wherein the source contact includes a portion that is wider than the source region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
performing a first etching process on a backside of a substrate to form a trench to expose a dummy contact structure;
performing a first deposition process to deposit a first portion of an oxide layer to fill an entirety of the trench and around the dummy contact structure;
performing a second etching process to at least partially remove the first portion of the oxide layer, thereby exposing a sidewall of the dummy contact structure;
after performing the second etching process, depositing a spacer layer on the exposed sidewall of the dummy contact structure and around the dummy contact structure;
performing a second deposition process to form a second portion of the oxide layer around the spacer layer;
removing the spacer layer and the dummy contact structure to leave an opening; and
filling the opening with a conductive material to form a conductive plug.

2. The method of claim 1, wherein the conductive plug includes a narrow portion and a wide portion,
wherein after performing the second etching process, a remaining portion of the first portion of the oxide layer remains,
wherein depositing the spacer layer further includes depositing the spacer layer on a surface of the remaining portion of the first portion of the oxide layer, and
wherein the conductive plug is in direct contact with the surface of the remaining portion of the first portion of the oxide layer.

3. The method of claim 1, further comprising:
epitaxially growing the dummy contact structure in the substrate; and
forming a source region in physical contact with the dummy contact structure,
wherein the conductive plug is in direct contact with the source region.

4. The method of claim 3, wherein a narrow portion of the conductive plug has a substantially similar width as the source region.

5. The method of claim 3, wherein a wide portion of the conductive plug has a larger width than the source region.

6. The method of claim 3, wherein the source region is connected to a nanostructure channel wrapped around by a gate structure on both sides,
wherein the spacer layer is directly below the nanostructure channel, and
wherein after performing the second etching process, a remaining portion of the first portion of the oxide layer remains on a surface of the gate structure in a cross-sectional view having the source region.

7. The method of claim 1, wherein the spacer layer comprises a material that has etching selectivity with the second portion of the oxide layer, and
wherein performing the first etching process exposes the sidewall of the dummy contact structure.

8. The method of claim 1, wherein the spacer layer comprises a material that has etching selectivity with a high-k gate dielectric material, and
wherein after performing the first deposition process, an entirety of sidewalls of the dummy contact structure is surrounded by the first portion of the oxide layer.

9. The method of claim 1, further comprising, before filling the opening with the conductive material, depositing a nitride layer on sidewalls of the opening.

10. The method of claim 1, further comprising, forming a silicide layer on a bottom of the opening directly adjacent to a source region.

11. A method comprising:
forming a first nanostructure stack and a second nanostructure stack on a frontside of a substrate;
thereafter, forming a dummy contact region between the first nanostructure stack and the second nanostructure stack and in the substrate;
forming a source region on the dummy contact region;
forming a first gate structure wrapping around the first nanostructure stack and a second gate structure wrapping around the second nanostructure stack;
on a backside of the substrate opposite to the frontside, performing an etching process to expose sidewalls of the dummy contact region, wherein the sidewalls of the dummy contact region align with sidewalls of the source region;
forming an oxide layer on a backside of the dummy contact region, the first gate structure, and the second gate structure;
etching back the oxide layer, thereby leaving a residual oxide layer, wherein the residual oxide layer contacts a surface of the first gate structure in a cross-sectional view including the first nanostructure stack, the source region, and the first gate structure;
forming spacers on the sidewalls of the dummy contact region; and
replacing the spacers and the dummy contact region with a conductive material to form a conductive plug, wherein at least a portion of the conductive plug has a wider diameter than the source region.

12. The method of claim 11, wherein performing the etching process forms a trench, and
wherein forming the oxide layer includes depositing the oxide layer in an entirety of the trench.

13. The method of claim 11, wherein the spacers comprise a different material than the dummy contact region.

14. The method of claim 11, wherein the spacers comprise a same material as the dummy contact region.

15. The method of claim 11, wherein the conductive plug includes a narrow portion and a wide portion,
wherein a portion of the wide portion is directly below the first gate structure, and
wherein forming a dummy contact region includes epitaxially growing the dummy contact region.

16. The method of claim 11, wherein the conductive plug is in direct contact with a source region, and
wherein forming the source region includes forming the source region directly on the dummy contact region.

17. A method comprising:
forming a first stack of nanostructures and a second stack of nanostructures on a frontside of a substrate;
thereafter, forming a dummy contact between the first stack and the second stack and in the substrate;
forming a source/drain feature on the dummy contact;
forming a gate structure wrapping around the first stack of nanostructures;
performing an etching process from a backside of the substrate to expose sidewalls of the dummy contact, the backside being opposite to the frontside;
depositing a spacer layer on a sidewall and a bottom surface of the dummy contact and on a surface of the gate structure;
removing the spacer layer and the dummy contact to form an opening; and
filling a conductive material in the opening to form a conductive plug.

18. The method of claim 17, after depositing the spacer layer, further comprising etching back the spacer layer to expose the dummy contact.

19. The method of claim 17, further comprising:
after depositing the spacer layer, depositing a dielectric layer around and below on a backside of the spacer layer and the dummy contact; and
etching back the dielectric layer to expose the spacer layer and the dummy contact.

20. The method of claim 17, wherein at least a portion of the conductive plug has a wider diameter than the source/drain feature.

* * * * *